(12) United States Patent
Krishnamoorthi et al.

(10) Patent No.: US 7,701,371 B2
(45) Date of Patent: Apr. 20, 2010

(54) DIGITAL GAIN COMPUTATION FOR AUTOMATIC GAIN CONTROL

(75) Inventors: Raghuraman Krishnamoorthi, San Diego, CA (US); Vinay Murthy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/696,105

(22) Filed: Apr. 3, 2007

(65) Prior Publication Data

US 2007/0229340 A1 Oct. 4, 2007

Related U.S. Application Data

(60) Provisional application No. 60/789,269, filed on Apr. 4, 2006.

(51) Int. Cl.
 *H03M 1/00* (2006.01)
(52) U.S. Cl. .................. 341/139; 375/345; 330/278; 704/500
(58) Field of Classification Search ......... 341/130–160; 330/278; 375/345
 See application file for complete search history.

(56) References Cited

U.S. PATENT DOCUMENTS

| | | | |
|---|---|---|---|
| 4,680,588 A | 7/1987 | Cantwell | |
| 5,150,384 A * | 9/1992 | Cahill | 375/375 |
| 5,687,241 A | 11/1997 | Ludvigsen | |
| 6,999,012 B2 * | 2/2006 | Kim et al. | 341/119 |
| 7,085,334 B2 * | 8/2006 | Burke et al. | 375/345 |
| 7,174,190 B2 * | 2/2007 | Walker et al. | 455/557 |
| 7,272,511 B2 * | 9/2007 | Occhipinti et al. | 702/32 |

FOREIGN PATENT DOCUMENTS

| | | |
|---|---|---|
| EP | 0 261 954 A2 | 3/1988 |
| EP | 1 548 929 A1 | 6/2005 |

OTHER PUBLICATIONS

J. Besseyre, "Digital Automatic Gain Control Circuit," IBM Technical Disclosure Bulletin, vol. 18, No. 2, Jul. 1, 1975, XP002448108.
International Search Report, PCT/US2007/066000—International Search Authority—European Patent Office—Oct. 17, 2007.
International Preliminary Report on Patentability, PCT/US2007/066000—The International Bureau of WIPO—Geneva, Switzerland—Oct. 8, 2008.
Written Opinion, PCT/US2007/066000—International Search Authority—European Patent Office—Oct. 17, 2007.

* cited by examiner

*Primary Examiner*—Lam T Mai
(74) *Attorney, Agent, or Firm*—Gerald P. Joyce, III

(57) ABSTRACT

Techniques for performing automatic gain control are described. In some aspects, the gain control is achieved with an apparatus having an analog-to-digital converter (ADC) and a digital variable gain amplifier (DVGA), the DVGA configured to receive a digital signal from the ADC, the DVGA having a processor configured to compute a gain using a base n logarithm based on the power of the digital signal output from the ADC, the processor being further configured to apply the gain to the digital signal.

25 Claims, 7 Drawing Sheets

DIGITAL GAIN COMPUTATION FOR AUTOMATIC GAIN CONTROL

The present Application for Patent claims priority to Provisional Application No. 60/789,269 entitled "Efficient Computation of Digital Gains for Automatic Gain Control" filed Apr. 4, 2006, and assigned to the assignee hereof and hereby expressly incorporated by reference herein.

BACKGROUND

1. Field

The present disclosed embodiments relates generally to communication, and more specifically to efficient computation of digital gains for automatic gain control.

2. Background

In a wireless communication system, a transmitter typically processes (e.g., encodes and modulates) data and generates a radio frequency (RF) modulated signal that is more suitable for transmission. The transmitter then transmits the RF modulated signal via a wireless channel to a receiver. The wireless channel distorts the transmitted signal with a channel response and further degrades the signal with noise and interference.

The receiver receives the transmitted signal, conditions the received signal to obtain a baseband signal, digitizes the baseband signal to obtain samples, and processes these digitized signals. The received signal level may vary over a wide range due to various channel propagation phenomena such as fading and shadowing. Hence, the receiver typically performs automatic gain control (AGC) to maintain the baseband signal level within an acceptable range. The AGC attempts to avoid saturation of receiver circuitry and clipping of an analog-to-digital converter (ADC) used to digitize the baseband signal.

In AGC, a variable gain amplifier (VGA) is commonly used to maintain constant signal amplitude. This VGA may be implemented as an analog variable gain amplifier (AVGA) or a digital variable gain amplifier (DVGA).

Using an AVGA has many disadvantages including, among other things, complicated circuitry for maintaining a linear-in-dB gain control characteristics, temperature compensation and considerable power consumption.

DVGAs overcome many of these disadvantages of AVGAs. However, computing and applying a digital gain for AGC is difficult.

There is therefore a need in the art for techniques to perform digital gain computation for AGC at a wireless receiver in an efficient and cost-effective manner.

SUMMARY

Techniques for efficient computation of digital gains for automatic gain control are described herein.

In some aspects, the computation of digital gains for AGC is achieved with an apparatus having an analog-to-digital converter (ADC), and a digital variable gain amplifier (DVGA). The DVGA is configured to receive a digital signal from the ADC, the DVGA having a processor configured to compute a gain using a base n logarithm based on the power of the digital signal output from the ADC, the processor being further configured to apply the gain to the digital signal. The base n logarithm may be a base 2 logarithm. The processor may be further configured to compute the gain using a base n logarithm by computing in separate operations a characteristic of the power and a mantissa of the power. The processor may be configured to additively combine the computed characteristic of the power and the computed mantissa of the power to form the gain. The processor may be configured to compute the characteristic of the power by comparing the characteristic of the digital signal with the characteristic of a reference power. The processor may be configured to compute the mantissa of the power by comparing the mantissa of the digital signal with the mantissa of a reference power.

In other aspects, the computation of digital gains for AGC is achieved with a digital variable gain amplifier (DVGA) coupled to an analog-to-digital converter (ADC), the DVGA configured to receive a digital signal from the ADC, compute a gain using a base n logarithm based on the power of the digital signal output from the ADC, and apply the gain to the digital signal. The base n logarithm may be a base 2 logarithm. The DVGA may be further configured to compute the gain using a base n logarithm by computing in separate operations a characteristic of the power and a mantissa of the power. The DVGA may be configured to additively combine the computed characteristic of the power and the computed mantissa of the power to form the gain. The DVGA may be configured to compute the characteristic of the power by comparing the characteristic of the digital signal with the characteristic of a reference power. The DVGA may be configured to compute the mantissa of the power by comparing the mantissa of the digital signal with the mantissa of a reference power.

In yet other aspects, the computation of digital gains for AGC is achieved with a method comprising providing an analog-to-digital converter (ADC), providing a digital variable gain amplifier (DVGA) configured to receive a digital signal from the ADC, computing a gain using a base n logarithm based on the power of the digital signal output from the ADC, and applying the gain to the digital signal. The base n logarithm may be a base 2 logarithm. The computing the gain using a base n logarithm may comprise computing in separate operations a characteristic of the power and a mantissa of the power. The computed characteristic of the power and the computed mantissa of the power may be additively combined to form the gain. The characteristic of the power may be computed by comparing the characteristic of the digital signal with the characteristic of a reference power. The mantissa of the power may be computed by comparing the mantissa of the digital signal with the mantissa of a reference power.

In some aspects, the computation of digital gains for AGC is achieved with a processing system comprising means for providing an analog-to-digital converter (ADC), means for providing a digital variable gain amplifier (DVGA) configured to receive a digital signal from the ADC, means for computing a gain using a base n logarithm based on the power of the digital signal output from the ADC, and means for applying the gain to the digital signal. The base n logarithm may be a base 2 logarithm. The processing system may further comprise means for computing the gain using a base n logarithm comprises computing in separate operations a characteristic of the power and a mantissa of the power. The processing system may comprise means for additively combining the computed characteristic of the power and the computed mantissa of the power to form the gain. The processing system may comprise means for computing the characteristic of the power by comparing the characteristic of the digital signal with the characteristic of a reference power. The processing system may comprise means for computing the mantissa of the power by comparing the mantissa of the digital signal with the mantissa of a reference power.

In other aspects, the computation of digital gains for AGC is achieved with a computer readable media containing a set of instructions for a DVGA processor to perform a method of computing a digital gain, the instructions comprising a routine to receive a digital signal from the ADC, a routine to compute a gain using a base n logarithm based on the power of the digital signal output from the ADC, and a routine to apply the gain to the digital signal. The base n logarithm may be a base 2 logarithm. The DVGA processor may be configured to compute the gain using a base n logarithm by computing in separate operations a characteristic of the power and a mantissa of the power. The DVGA processor may be configured to additively combine the computed characteristic of the power and the computed mantissa of the power to form the gain. The DVGA processor may be configured to compute the characteristic of the power by comparing the characteristic of the digital signal with the characteristic of a reference power. The DVGA processor may be configured to compute the mantissa of the power by comparing the mantissa of the digital signal with the mantissa of a reference power.

Various aspects and embodiments of the invention are described in further detail below.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The AGC techniques described herein may be used for various wireless communication systems such as cellular systems, broadcast systems, wireless local area network (WLAN) systems, and so on. The cellular systems may be Code Division Multiple Access (CDMA) systems, Time Division Multiple Access (TDMA) systems, Frequency Division Multiple Access (FDMA) systems, Orthogonal Frequency Division Multiple Access (OFDMA) systems, Single-Carrier FDMA (SC-FDMA) systems, and so on. The broadcast systems may be MediaFLO systems, Digital Video Broadcasting for Handhelds (DVB-H) systems, Integrated Services Digital Broadcasting for Terrestrial Television Broadcasting (ISDB-T) systems, and so on. The WLAN systems may be IEEE 802.11 systems, Wi-Fi systems, and so on. These various systems are known in the art.

The AGC techniques described herein may be used for systems with a single subcarrier as well as systems with multiple subcarriers. Multiple subcarriers may be obtained with OFDM, SC-FDMA, or some other modulation technique. OFDM and SC-FDMA partition a frequency band (e.g., the system bandwidth) into multiple orthogonal subcarriers, which are also called tones, bins, and so on. Each subcarrier may be modulated with data. In general, modulation symbols are sent on the subcarriers in the frequency domain with OFDM and in the time domain with SC-FDMA. OFDM is used in various systems such as MediaFLO, DVB-H and ISDB-T broadcast systems, IEEE 802.11a/g WLAN systems, and some cellular systems. Certain aspects and embodiments of the AGC techniques are described below for a broadcast system that uses OFDM, e.g., a MediaFLO system.

Block diagrams described herein may be implemented using any known methods for implementing computational logic. Examples of methods for implementing computational logic include field-programmable gate array (FPGA), application-specific integrated circuit (ASIC), complex programmable logic devices (CPLD), integrated optical circuits (IOC), microprocessors, and so on.

Figure 1:
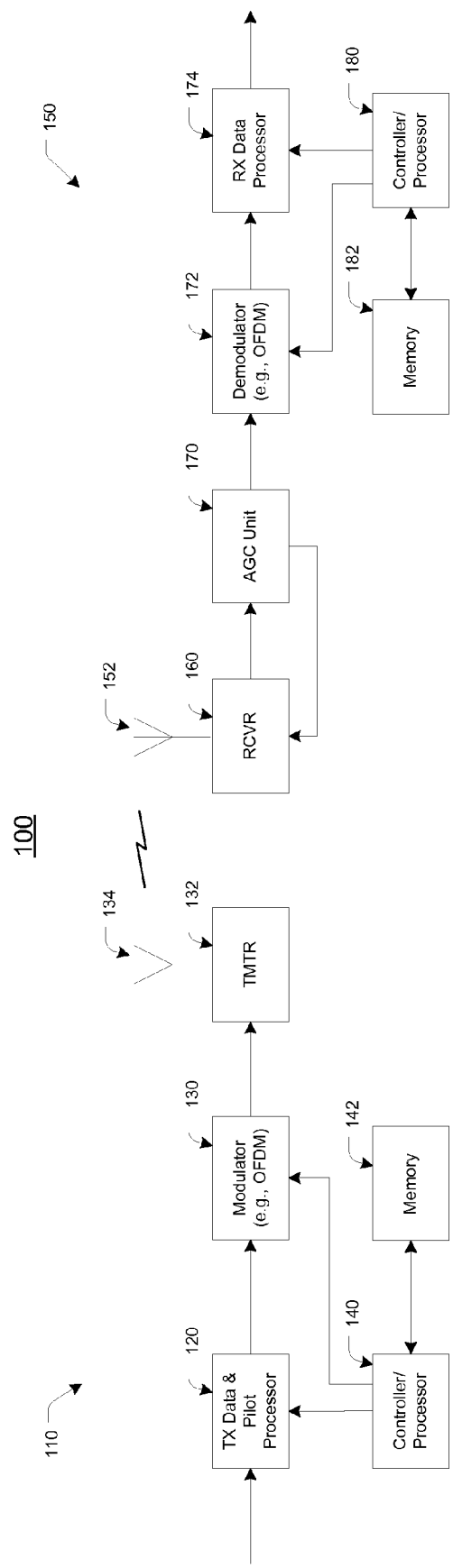
FIG. 1 is a block diagram of a transmitter and a receiver.

FIG. 1 shows a block diagram of a transmitter 110 and a receiver 150 in a wireless communication system 100. Transmitter 110 may be part of a base station, and receiver 150 may be part of a terminal. Conversely, transmitter 110 may be part of a terminal, and receiver 150 may be part of a base station. A base station is typically a fixed station and may also be called a base transceiver system (BTS), an access point, a Node B, and so on. A terminal may be fixed or mobile and may also be called a mobile station, a user equipment, a mobile equipment, and so on. A terminal may be a cellular phone, a personal digital assistant (PDA), a wireless modem, a wireless communication device, a handheld device, a subscriber unit, and so on.

At transmitter 110, a transmit (TX) data and pilot processor 120 processes (e.g., encodes, interleaves, and symbol maps) traffic data and generates data symbols.

Processor 120 also generates pilot symbols. As used herein, a data symbol is a modulation symbol for data, a pilot symbol is a modulation symbol for pilot, and a modulation symbol is a complex value for a point in a signal constellation, e.g., for PSK or QAM. A modulator 130 multiplexes the data symbols and pilot symbols, performs OFDM modulation on the multiplexed data and pilot symbols, and generates OFDM symbols. A transmitter unit (TMTR) 132 processes (e.g., converts to analog, amplifies, filters, and frequency upconverts) the OFDM symbols and generates a modulated signal, which is transmitted via an antenna 134.

At receiver 150, an antenna 152 receives the modulated signal from transmitter 110 and provides a received signal to a receiver unit (RCVR) 160. Receiver unit 160 conditions (e.g., filters, amplifies, and frequency downconverts) the received signal to obtain a baseband signal and further digitizes the baseband signal to obtain input samples. An AGC unit 170 performs automatic gain control, adjusts the gain of receiver unit 160 as appropriate, multiplies the input samples with a variable digital gain, and provides output samples having the desired average power. A demodulator 172 performs OFDM demodulation on the output samples and provides data symbol estimates, which are estimates of the data symbols sent by transmitter 110. A receive (RX) data processor 174 processes (e.g., symbol demaps, deinterleaves, and decodes) the data symbol estimates and provides decoded data. In general, the processing at receiver 150 is complementary to the processing at transmitter 110.

Controllers/processors 130 and 180 direct the operation of various processing units at transmitter 110 and receiver 150, respectively. Memories 142 and 182 store program codes and data for transmitter 110 and receiver 150, respectively.

Figure 2:
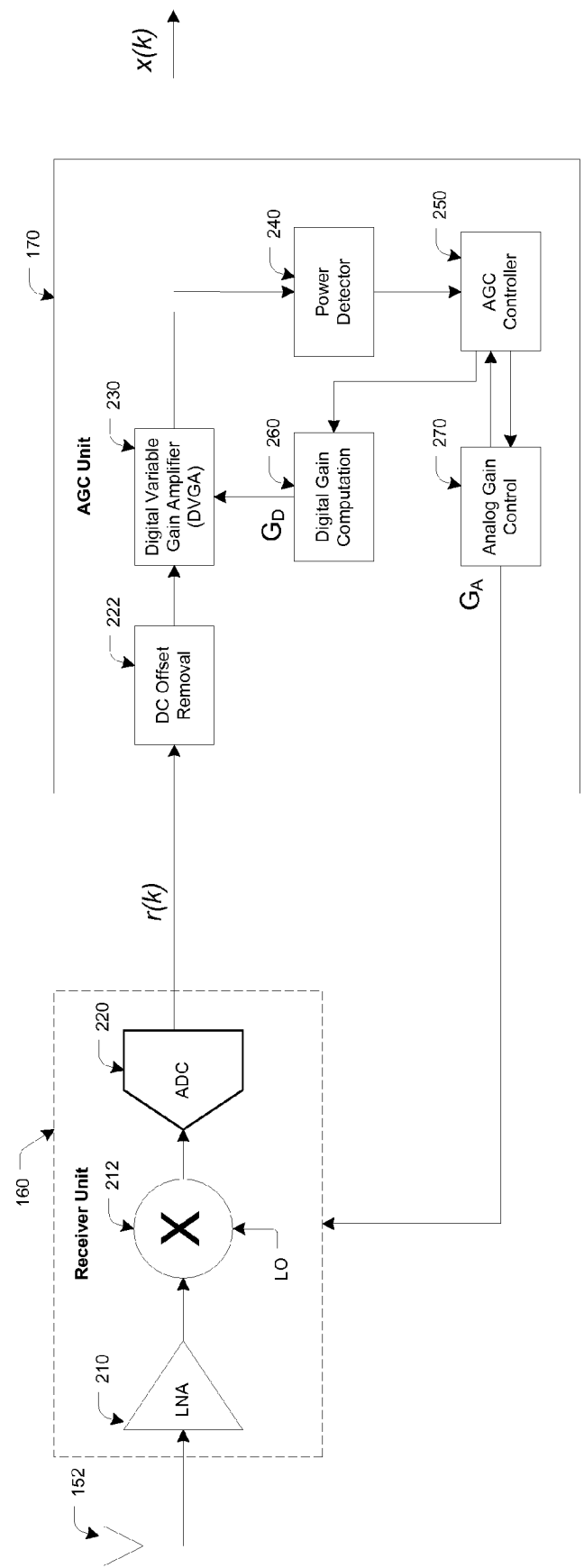
FIG. 2 is a block diagram of a receiver unit and an AGC unit.

FIG. 2 shows a block diagram of an embodiment of receiver unit 160. Within receiver unit 160, a low noise amplifier (LNA) 210 amplifies the received signal from antenna 152 with a fixed or variable gain and provides an amplified signal. A mixer 212 frequency downconverts the amplified signal with a local oscillator (LO) signal and provides a baseband signal. Mixer 212 may also amplify its input signal and/or output signal with a fixed or variable gain. Mixer 212 may implement a super-heterodyne architecture that downconverts the received signal in multiple stages, e.g., from RF to an intermediate frequency (IF), and then from IF to baseband. Mixer 212 may also implement a direct-to-baseband architecture, which is also referred to as a zero IF (ZIF) architecture, that downconverts the received signal directly from RF to baseband in one stage. An ADC 220 digitizes the baseband signal and provides input samples r(k) to AGC unit 170, where k is an index for sample period. ADC 220 may be a sigma-delta ADC (ΣΔ ADC), a successive approximation ADC, or some other type of ADC. The input samples are typically complex-valued samples having inphase (I) and quadrature (Q) components.

For simplicity, FIG. 2 shows only some of the circuit blocks that may be used in a receiver unit. In general, a receiver unit may include one or more stages of amplifier, filter, mixer, and so on. For example, a bandpass filter may be provided before mixer 212, and a lowpass filter may be provided after mixer 212. A receiver unit may also include any number of circuit blocks with variable gain, and these circuit blocks may be located anywhere in the receive path. For example, LNA 210 and/or mixer 212 may have variable gain.

The received signal level may vary over a very wide range, e.g., from −98 dBm to −20 dBm. This wide receive dynamic range may result from various channel propagation phenomena such as fading and shadowing. The received signal may also include interfering signals (or "jammers") that may be much larger in amplitude than a desired signal. In the following description, the terms "power", "energy", "signal level" and "signal strength" are used interchangeably and refer to the amplitude of a signal.

AGC may be used to account for the wide dynamic range of the received signal, to maintain the baseband signal level within a suitable range for the ADC, and to provide output samples having approximately constant average power. The AGC design may be dependent on various factors such as the dynamic range of the received signal (or receive dynamic range), the input dynamic range of the ADC (or ADC input dynamic range), the manner in which the analog gain is varied in the receiver unit, and so on. For example, the receive dynamic range and the ADC input dynamic range may determine the range of analog gains needed for the receiver unit and the specific analog gains to use for different received signal levels.

In an aspect, AGC is achieved using analog gain that may be varied in coarse discrete steps and digital gain that may be varied continuously or in fine steps. The discrete gain steps in the analog domain may simplify the design of the receiver unit and may reduce cost. The continuous digital gain may be implemented in a cost-effective manner with digital circuitry.

For clarity, a specific embodiment of receiver unit 160 and AGC unit 170 is described below. In this embodiment, the AGC has four states. The AGC states may also be referred to as gain states, AGC gain states, receiver states, gain modes, and so on. Each AGC state is associated with a specific analog gain. The AGC operates in one of the four AGC states at any given moment. This AGC state is selected based on the received signal level. Receiver unit 160 operates with the analog gain associated with the selected AGC state.

Figure 3:
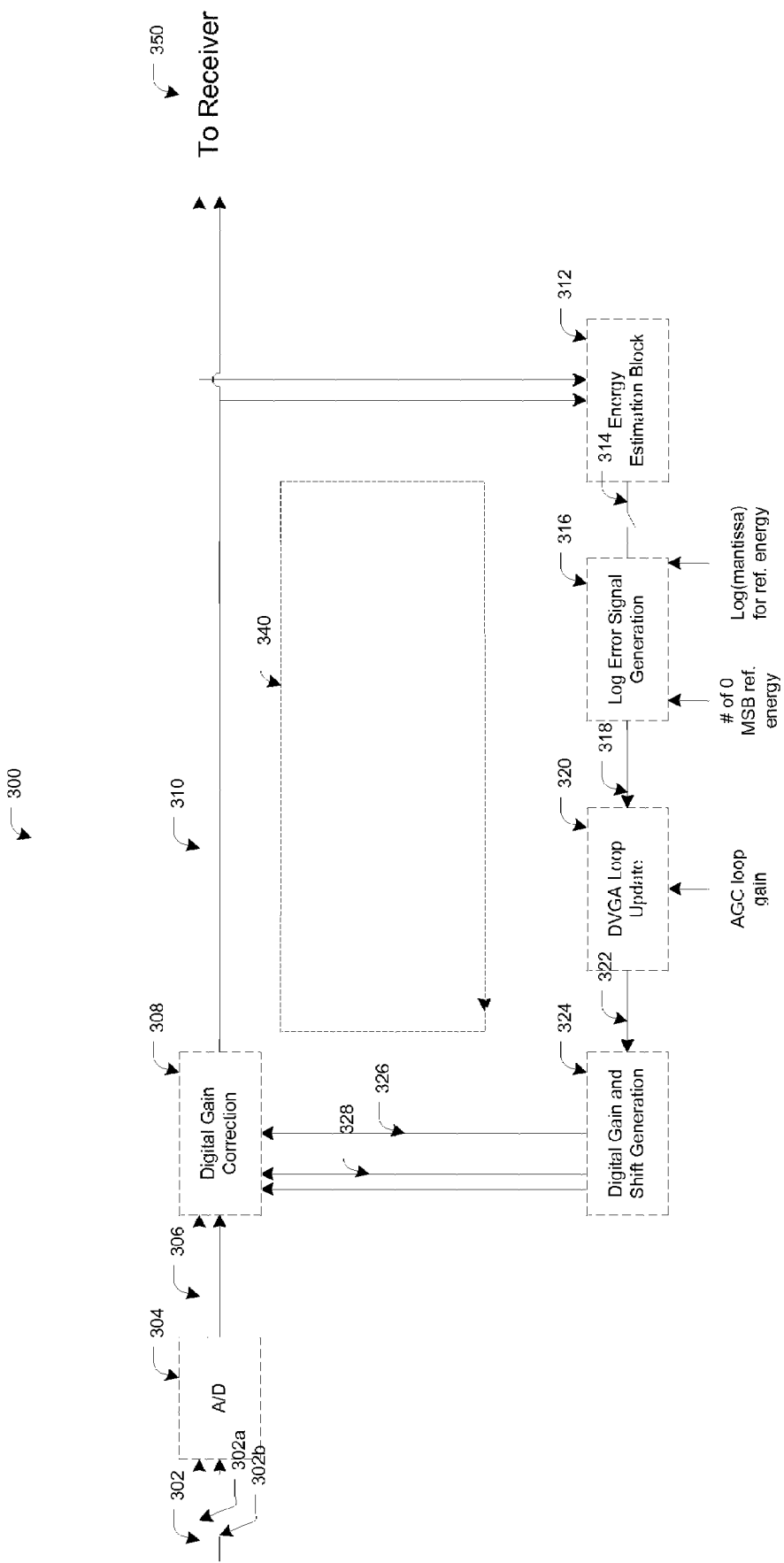
FIG. 3 is a block diagram of a DVGA for AGC.

FIG. 3 shows a block diagram of an AGC/DVGA feedback loop 300 of an AGC Unit 170 in greater detail. In some embodiments, the implementation uses one or more efficient logic elements to compute the logarithmic error signal from the received signal power measurement and the digital gain from the logarithmic estimate of the gain to be applied.

An analog signal 302 is first received by an analog-to-digital converter 304 (A/D or ADC) and is converted from an analog signal 302 to a corresponding discrete digital representation 306 (digital signal). Typically, an ADC is an electronic device that converts an input analog voltage into a digital number. The digital output may be further processed as desired. In this current implementation, the digital signal is used downstream by an associated demodulator chain (e.g. FFT) and receiver.

This digital representation 306 expresses the analog signal as an I/Q sample and is further processed for digital gain. Usually, the analog signal 302 has been corrected for analog gain although in other embodiments, analog gain correction may not be necessary. A two channel (e.g. left and right) analog input 302a 302b producing a two channel digital output 306 is described. The same principle applies to any number of channels.

Next, a digital gain correction unit 308 receives the digital signal 306, determines the correct digital gain 326 to apply to the signal 306 based on a reference power, and applies the appropriate digital power correction. The digitally corrected signal 310 is transmitted to the associated demodulator chain and receiver 350.

The demodulator chain and receiver 350 processes signals more efficiently if the signals have a constant power. Because large variations in power produce substantial processing inefficiencies, much inefficiency can be largely overcome by accurate gain control. To more accurately calibrate the gain, the digitally corrected signal 310 is transmitted to a feedback loop 340 that adjusts the digital gain correction 326 used. In some embodiments, a feed-forward loop may be employed instead.

In the feedback loop, first, in addition to the demodulator chain and receiver 350, the corrected signal 310 is transmitted to an energy estimation block 312. The energy estimation block 312 generates a measured power 314 (received signal power), which is inputted to a log error signal generation unit 316. The log error signal generation unit 316 uses the measured power 314 and a reference power to determine an error signal 318. The error signal 318 describes the difference between the measured power 314 and a reference power (ref.).

Next, a DVGA Loop Update unit 320 uses the error signal 318 and an AGC loop gain to determine an accumulator value 322. The accumulator value 322 simplifies the gain determination logic 324 and provides for flexibility in determining the distribution of DVGA gain 326 across a fixed dynamic range. Using the accumulator value 322, the digital gain and shift generation unit 324 (DGSG) determines the appropriate the digital gain 326 and digital shift 328 for the digital gain correction unit 324, thereby completing the feedback loop 340.

Calculation of the digital gain correction factor can be computationally intensive and inefficient. Because DVGAs often process real-time streaming information, the digital gain correction cannot impose a significant information delay. Approaches to overcoming the delay include incorporating more powerful processors for processing each unit or implementing each unit more efficiently.

One significant source of computation load is the log error signal generation unit 316. Although the log error signal is already an improvement over a non-log approach to DVGA, log calculations require considerably more processor clock cycles than an addition, for example. Further, as the signal bit size increases, log computation resource requirements also increases. If the log computation uses a lookup table (LUT), the LUT size would increase as the bit size increased. If the log were computed directly, the number of processor clock cycles would need to increase as the bit size increased.

Figure 4:
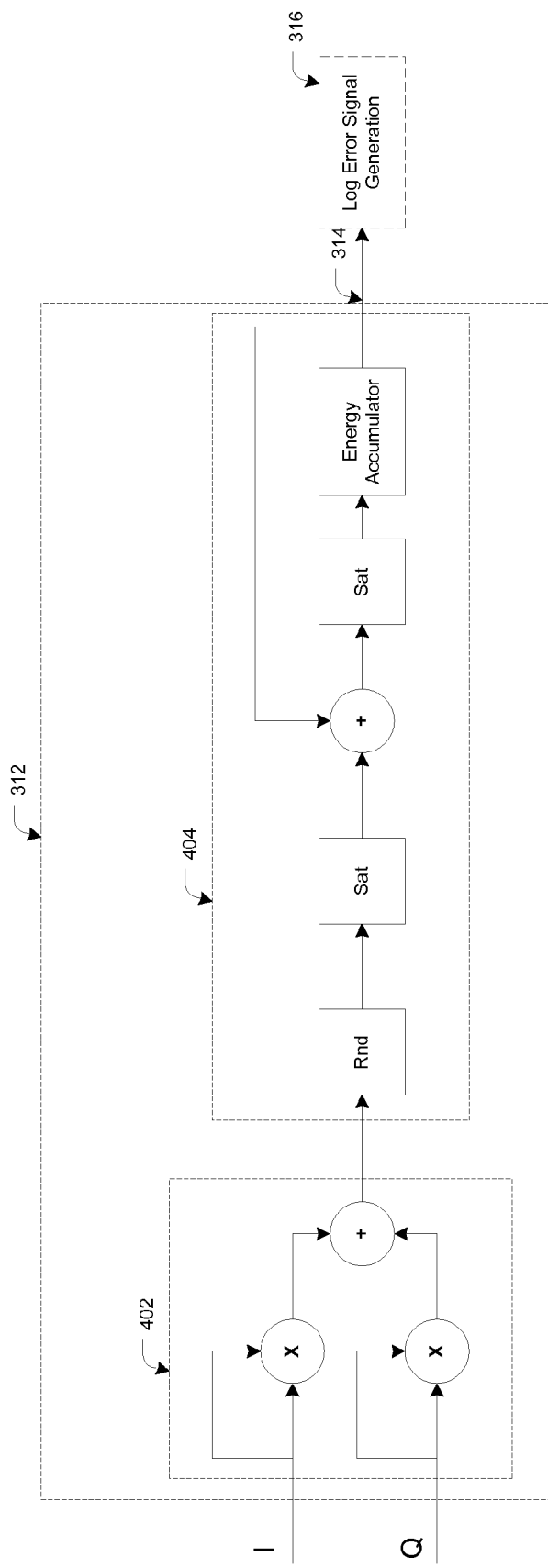
FIG. 4 is a block diagram of an energy estimation unit.

FIG. 4 shows an illustrative fixed point implementation of the energy estimation block 312. The log error signal unit 316 calculates the error signal for the measured power 314, which is produced by the energy estimation block 312.

In this illustrative example, the energy estimation block 312 calculates the energy of the received samples 310 over a window of length L using the following equation (Equation 1). EnergyEstScale refers to the scale factor determined by the fixed point implementation.

$$EnergyEst = \frac{1}{L}\sum_{n=0}^{L-1}|x(n)|^2 \cdot EnergyEstScale \qquad (1)$$

$$\approx E[|x(n)|^2] \cdot EnergyEstScale$$

The block 312 dumps every $N_{dump}$ samples. Of the remaining samples, the power for the channels is combined. For every L sample, the I and Q parts initially are squared and summed (circuit 402) to produce the $|x(n)|^2$. The summation is adjusted (Rnd (rounding) and Sat (saturation)) and summed (circuit 404) over the window length L to produce the energy estimate (EnergyEst). This produces an energy estimate for use by the log error signal generation unit 316. Examples illustrative approaches include using a running average of the power of each sample, or computing the mean of the absolute value of the samples and then relating the mean of the absolute value to the mean of the square of the samples. Other energy method computations are within the scope of this disclosure.

FIG. 4 is an illustrative example of how the energy accumulation block may be implemented. Other implementations of the energy estimation block are within the scope of this disclosure. For example, other implementations may include the use of operational amplifiers, integration circuits, ASIC, or FPGA.

Figure 5:
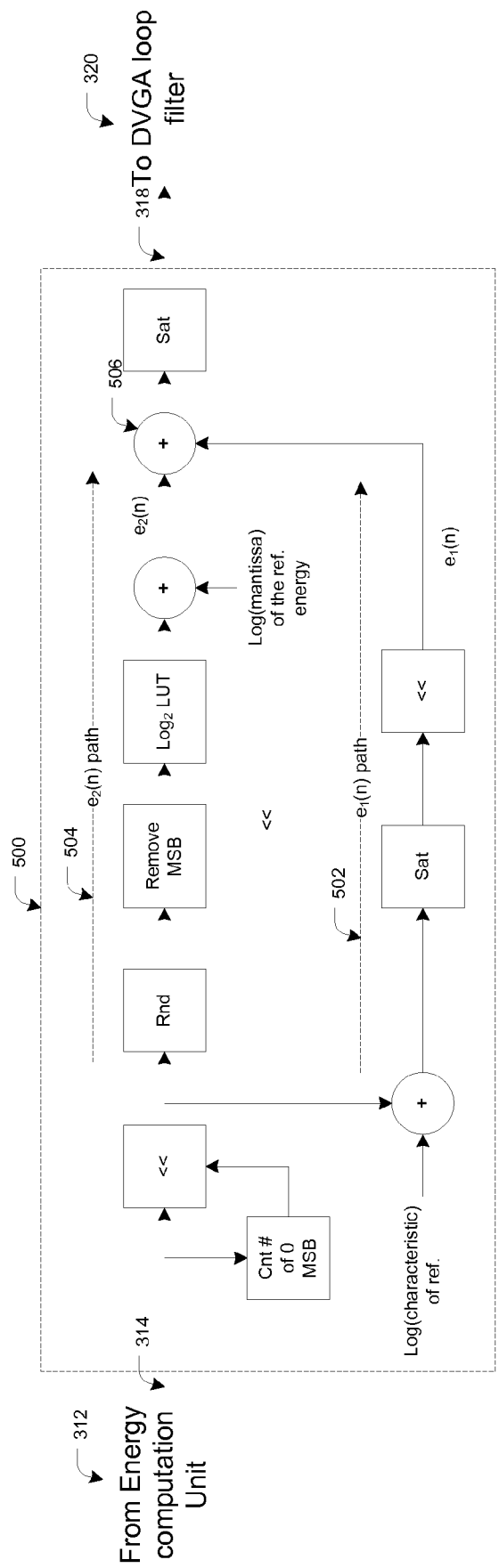
FIG. 5 is a block diagram of a log error signal generation unit.

FIG. 5 shows an efficient calculation (and the logic for the calculation) of the error signal and an implementation. A log error signal is generated from the measured and the reference powers. The log error signal can be calculated directly as the difference between the $\log_{10}$ of the reference power and the $\log_{10}$ of the measured power. However, the difference can be determined much more efficiently in $\log_2$ as follows.

Let e(n) denote the error signal to be generated, where e(n) is the difference between the received signal power and the reference power. In these embodiments, for efficient implementation, the error is computed using $\log_2$ arithmetic as described by the following equation (Equation Set 2).

$$e(n) = \log_2\left(\frac{E_{ref}}{E_{measured}}\right) \times 2^{logLUTDataprec} \qquad (2)$$

$$e(n) = e_1(n) + e_2(n)$$

$$e_1(n) = \left[\begin{array}{c}\text{characteristic}(E_{ref}) - \\ \text{characteristic}(E_{Measured})\end{array}\right] 2^{logLUTDataprec}$$

$$e_2(n) = \left[\begin{array}{c}\text{mantissa}(E_{ref}) - \\ \text{mantissa}(E_{Measured})\end{array}\right] 2^{logLUTDataprec}$$

The computation of the error signal is performed in two steps, namely, the calculation of the difference in the characteristic $e_1(n)$, and the difference of the mantissa, $e_2(n)$. The log of a number can be split into two parts: the index or characteristic consisting of the part to the left of the decimal point (the integer part), and the mantissa, the part to the right of the decimal point (fractional part). For example, the characteristic of 2.6742 is 2 and the mantissa is 0.6742.

Since base 2 logarithm is used, the characteristic of the logarithm (base 2) can be obtained directly by counting the number of zero most significant bits (MSBs) in $E_{measured}$ as shown in Equation 3. In Equation 3, K is the bitwidth of $E_{measured}$.

$$\text{characteristic}(E_{measured}) = (K - \#\text{of 0MSBs in } E_{measured} - 1) \qquad (3)$$

The mantissa is obtained using a lookup table (LUT). Since the mantissa is bounded by 0 and 1, the logarithm can be obtained quickly through a relatively small lookup table. Note the logarithm can be any base since changing the base of a logarithm is equivalent to multiplying with a constant.

To illustrate with an example, to determine $\log_2 110.1110$, note that the number has 3 digits to the left of the decimal point and four to the right. The three digits to the left indicate that the integer (characteristic) of the log is between 2 and 3. To find the fractional part (mantissa) of the log, a lookup table (mantissa LUT) is employed.

In some embodiments, the mantissa LUT can be derived and implemented as follows (Equation Set 4):

$$logLUTaddr = \text{round}\left[\left(\frac{E_{measured}}{2^{characteristic}} - 1\right)2^{logLUTAddrprec}\right] \qquad (4)$$

$$\text{mantissa}(E_{measured}) \cdot 2^{logLUTDataprec} = logLUT[logLUTAddr]$$

$$= \text{round}\left[\left(\log_2\left(\frac{logLUTAddr}{2^{logLUTAddrprec}}\right) + 1\right)2^{logLUTDataprec}\right]$$

"Log LUTaddr" is the LUT address (index) in the log lookup table. "LogLUTAddrprec" is the address's precision. "logLUTDataprec" is the data precision.

Using this approach, the error signal in Equation Set 2 can be implemented and obtained as follows (Equation Set 5).

$$e(n) = e_1(n) + e_2(n) \qquad (5)$$

where, $$e_1(n) = (K - \#0\ MSBs_{ref} - 1) -$$
$$\qquad (K - \#\text{ of } 0\ MSBs_{Measured} - 1) \cdot 2^{logLUTDataprec}$$
$$\qquad = (\#\text{ of } 0\ MSBs_{Measured} - \#0\ MSBs_{ref}) \cdot 2^{logLUTDataprec}$$

$$e_2(n) = \text{mantissa}(E_{ref}) \cdot 2^{logLUTDataprec} -$$
$$\qquad \text{mantissa}(E_{measured}) \cdot 2^{logLUTDataprec}$$

$$logref Mantissa = \text{mantissa}(E_{ref}) \cdot 2^{logLUTDataprec}$$

One embodiment 500 of the circuit's logic can be implemented as showed in FIG. 5. The log error signal generation circuit 500 calculates the characteristic via the $e_1(n)$ path 502 and the mantissa via the $e_2(n)$ path 504. $e_1(n)$ and $e_2(n)$ are combined, the sum adjusted to conform to the specification parameters required by the DVGA Loop Update unit 320.

FIG. 5 is an illustrative example 500 of how the log error signal generation block 316 may be implemented. Other implementations of the block are within the scope of this disclosure. For example, other implementations may include the use of operational amplifiers, integration circuits, ASIC, or FPGA.

Referring back to FIG. 3, after the log error signal generation unit 316 determines the appropriate error signal, the loop update unit 320 receives the error signal 318 and an AGC loop gain, and updates the DVGA loop. Inside the loop update unit 320, the error signal and the AGC loop gain are multiplied. The error signal is multiplied by the loop gain and the result is accumulated by performing the update. The AGC loop accumulator value is initialized to simplify the gain determination logic and to provide for flexibility in determining the distribution of DVGA gain across fixed dynamic ranges.

After the loop update 320, the output is stored in an accumulators, storing the characteristic and the mantissa separately. The DVGA gain can be efficiently computed from the accumulator value as follows (Equation Set 6). Note that since accumulator values are stored in the logarithmic domain, computing the square root is reduced to division by 2 followed by a table lookup.

$$G = 2^{(d(n)-2*AccOffset)/2}$$

$$G = 2^{\lfloor(d(n)-2*AccOffset)/2\rfloor} 0.2^{frac(d(n)/2)}$$

where $frac(x) = x - floor(x)$, the fractional part

Defining, $$Shift = 2^{\lfloor(d(n)-AccOffset)/2\rfloor} = 2^{\lfloor(d(n)/2\rfloor} 0.2^{-AccOffset}$$

$$DVGA\ Mult\ Gain = 2^{frac(d(n)/2)} - 1$$

$$G = (1 + DVGA\ Mult\ Gain) 0.2^{Shift} \quad (6)$$

The number of bits x for the characteristic in the loop accumulator determines the total dynamic range of the DVGA as: $(2^{x-1})(20 \log_{10}(2))$. AccOffset controls the partitioning of the dynamic range between amplification and attenuation. For a given value of AccOffset, the maximum and minimum possible gains are $(2^{-AccOffset}, 2^{c-AccOffset})$, where $c = 2^{x-1}$.

A shift is applied on the incoming samples and the shifted output is transmitted back to the digital gain correction unit 308.

The gain is obtained using an LUT. The least significant bit (LSB) of the accumulator are rounded and used as the address to a lookup table that stores the values of the gain lookup table. Because $\log_2$ arithmetic was used, the digital gain may be applied using a shift followed by a multiplier.

Figure 6:
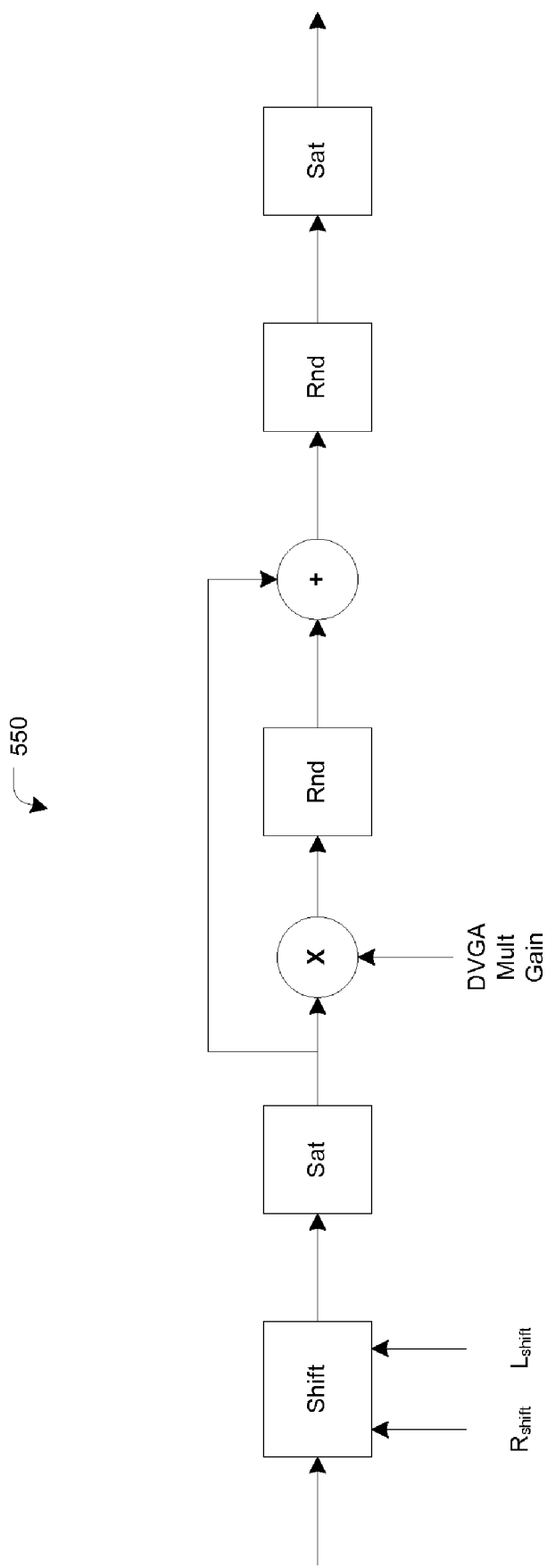
FIG. 6 is a block diagram of a circuit for applying the digital gain.

FIG. 6 shows one implementation 550 of the logic for applying the digital gain.

$R_{shift}$ and $L_{shift}$ is right shift and left shift, respectively. Mathematically, the overall gain applied by the block is:

$$GainLUT[i] = round((2^{i/2^{GainLUTAddrPrec}} - 1).(1 << GainLUTData\ Prec))$$

Figure 7:
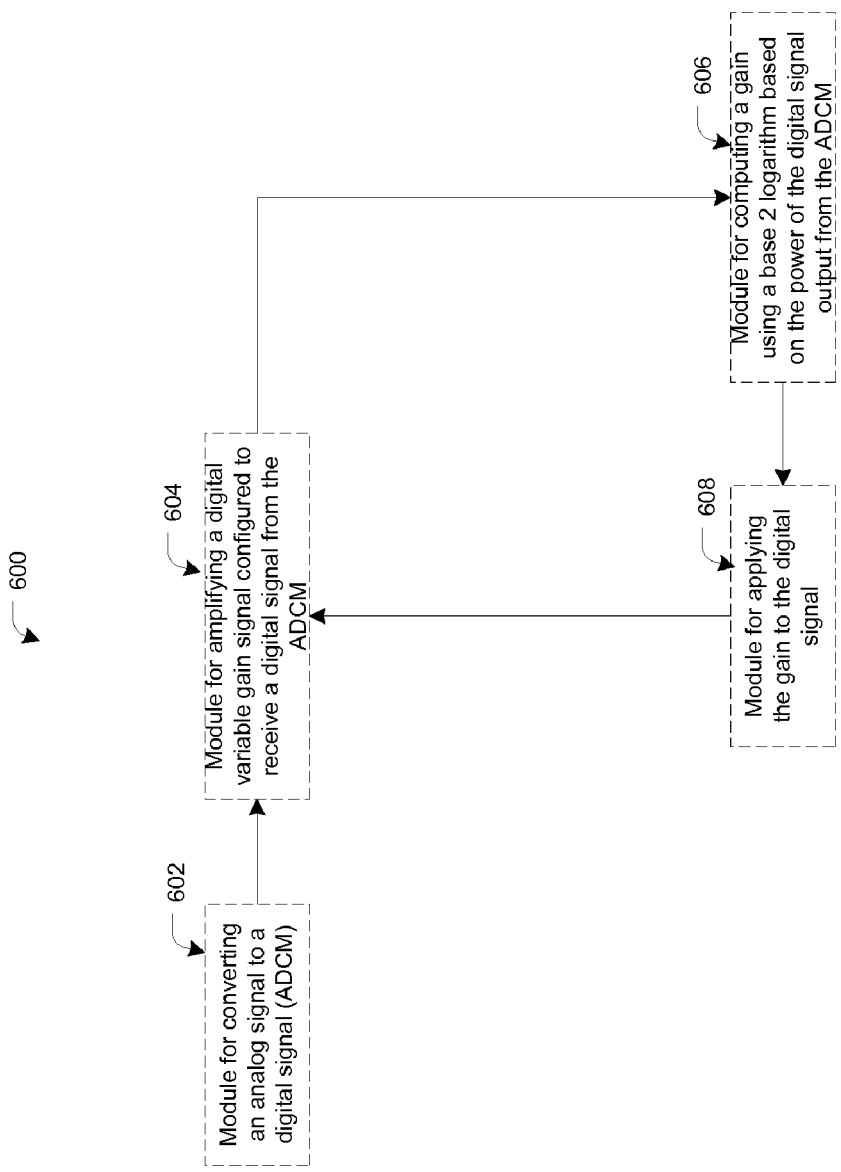
FIG. 7 is a block diagram of a DVGA for AGC.

FIG. 7 shows a block diagram design of another exemplary implementation of an AGC/DVGA feedback loop 600 of an AGC Unit 170 in greater detail. The components illustrated in FIG. 3 can be implemented by modules as shown here in FIG. 7. The information flow between these modules is similar to that of FIG. 3 and described in FIGS. 4, 5, and 6. As a modular implementation 600, the processing system comprises a module 602 for converting an analog signal to a digital signal (ADCM), a module 604 for amplifying a digital variable gain signal configured to receive a digital signal from the ADCM, a module 606 for computing a gain using a base 2 logarithm based on the power of the digital signal output from the ADCM, and a module 608 for applying the gain to the digital signal. Each of these modules 602, 604, 606, 608 may be implemented within a single module or using multiple sub-modules.

In some embodiments, the computation module for computing the gain using a base 2 logarithm may compute in separate operations a characteristic of the power and a mantissa of the power. The computation module may additively combine the computed characteristic of the power and the computed mantissa of the power to form the gain. Further, computing the characteristic of the power may be accomplished by comparing the characteristic of the digital signal with the characteristic of a reference power. Computing the mantissa of the power may also be accomplished by comparing the mantissa of the digital signal with the mantissa of a reference power.

The DVGA processing techniques described herein may be implemented by various means. For example, these techniques may be implemented in hardware, firmware, software, or a combination thereof. For a hardware implementation, the processing units used to perform DVGA may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the techniques may be implemented with modules (e.g., procedures, functions, and so on) that perform the functions described herein. The firmware and/or software codes may be stored in a memory and executed by a processor. The memory may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
an analog-to-digital converter (ADC); and
a digital variable gain amplifier (DVGA) configured to receive a digital signal from the ADC, the DVGA having a processor configured to compute a gain using a base n logarithm to compute a characteristic of a power of the digital signal output from the ADC by comparing a characteristic of the digital signal with a characteristic of a reference power, the processor being further configured to apply the gain to the digital signal.

2. The apparatus in claim 1, wherein:
the base n logarithm is a base 2 logarithm.

3. The apparatus in claim 1, wherein:
the processor is further configured to compute the gain using a base n logarithm by computing in separate operations the characteristic of the power and a mantissa of the power.

4. The apparatus in claim 3, wherein:
the processor is further configured to additively combine the computed characteristic of the power and the computed mantissa of the power to form the gain.

5. An apparatus comprising:
an analog-to-digital converter (ADC); and
a digital variable gain amplifier (DVGA) configured to receive a digital signal from the ADC, the DVGA having a processor configured to compute a gain using a base n logarithm to compute a mantissa of a power of the digital signal output from the ADC by comparing a mantissa of the digital signal with a mantissa of a reference power, the processor being further configured to apply the gain to the digital signal.

6. A digital variable gain amplifier (DVGA) coupled to an analog-to-digital converter (ADC), the DVGA configured:
to receive a digital signal from the ADC;
to compute a gain using a base n logarithm to compute a characteristic of a power of the digital signal output from the ADC by comparing a characteristic of the digital signal with a characteristic of a reference power; and
to apply the gain to the digital signal.

7. The DVGA in claim 6, wherein:
the base n logarithm is a base 2 logarithm.

8. The DVGA in claim 6, wherein:
the DVGA is further configured to compute the gain using a base n logarithm by computing in separate operations the characteristic of the power and a mantissa of the power.

9. The DVGA in claim 8, wherein:
the DVGA is further configured to additively combine the computed characteristic of the power and the computed mantissa of the power to form the gain.

10. A digital variable gain amplifier (DVGA) coupled to an analog-to-digital converter (ADC), the DVGA configured:
to received a digital signal from the ADC;
to compute a gain using a base n logarithm to compute a mantissa of a power of the digital signal output from the ADC by comparing a mantissa of the digital signal with a mantissa of a reference power; and
to apply the gain to the digital signal.

11. A method comprising:
providing an analog-to-digital converter (ADC);
providing a digital variable gain amplifier (DVGA) configured to receive a digital signal from the ADC;
computing a gain using a base n logarithm to compute a characteristic of a power of the digital signal output from the ADC by comparing a characteristic of the digital signal with a characteristic of a reference power; and
applying the gain to the digital signal.

12. The method in claim 11, wherein:
the base n logarithm is a base 2 logarithm.

13. The method in claim 11, wherein:
computing the gain using a base n logarithm comprises computing in separate operations the characteristic of the power and a mantissa of the power.

14. The method in claim 13, further comprising:
additively combining the computed characteristic of the power and the computed mantissa of the power to form the gain.

15. A method comprising:
providing an analog-to-digital converter (ADC);
providing a digital variable gain amplifier (DVGA) configured to receive a digital signal from the ADC;
computing a gain using a base n logarithm to compute a mantissa of the power of the digital signal output from the ADC by comparing a mantissa of the digital signal with a mantissa of a reference power; and
applying the gain to the digital signal.

16. A processing system comprising:
means for converting an analog signal to a digital signal (ADCM);
means for amplifying a digital variable gain signal configured to receive a digital signal from the ADCM;
means for computing a gain using a base n logarithm to compute a characteristic of a power of the digital signal output from the ADCM by comparing a characteristic of the digital signal with a characteristic of a reference power; and
means for applying the gain to the digital signal.

17. The processing system in claim 16, wherein:
the base n logarithm is a base 2 logarithm.

18. The processing system in claim 16, further comprising:
means for computing the gain using a base n logarithm comprises computing in separate operations the characteristic of the power and a mantissa of the power.

19. The processing system in claim 18, further comprising:
means for additively combining the computed characteristic of the power and the computed mantissa of the power to form the gain.

20. A processing system comprising:
means for converting an analog signal to a digital signal (ADCM);
means for amplifying a digital variable gain signal configured to receive a digital signal from the ADCM;
means for computing a gain using a base n logarithm compute a mantissa of the power of the digital signal output from the ADCM by comparing a mantissa of the digital signal with a mantissa of a reference power.

21. Computer readable media containing a set of instructions for a DVGA processor compute a digital gain, the instructions comprising:
a routine to receive a digital signal from the ADC;
a routine to compute a gain using a base n logarithm based to compute a characteristic of a power of the digital signal output from the ADC by comparing a characteristic of the digital signal with a characteristic of a reference power; and
a routine to apply the gain to the digital signal.

22. The computer readable media in claim 21, wherein:
the base n logarithm is a base 2 logarithm.

23. The computer readable media in claim 21, wherein:
the DVGA processor is configured to compute the gain using a base n logarithm by computing in separate operations the characteristic of the power and a mantissa of the power.

24. The computer readable media in claim 23, wherein:
the DVGA processor is further configured to additively combine the computed characteristic of the power and the computed mantissa of the power to form the gain.

25. Computer readable media containing a set of instructions for a DVGA processor to compute a digital gain, the instructions comprising:
a routine to receive a digital signal from the ADC;
a routine to compute a gain using a base n logarithm to compute a mantissa of a power of the digital signal output from the ADC by comparing a mantissa of the digital signal with a mantissa of a reference power; and
a routine to apply the gain to the digital signal.

* * * * *